US011031331B2

(12) United States Patent
El-Hinnawy et al.

(10) Patent No.: US 11,031,331 B2
(45) Date of Patent: Jun. 8, 2021

(54) PHASE-CHANGE MATERIAL (PCM) RADIO FREQUENCY (RF) SWITCHES WITH TRENCH METAL PLUGS FOR RF TERMINALS

(71) Applicant: Newport Fab, LLC, Newport Beach, CA (US)

(72) Inventors: Nabil El-Hinnawy, Irvine, CA (US); Gregory P. Slovin, Irvine, CA (US); Jefferson E. Rose, Hawthorne, CA (US); David J. Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 40 days.

(21) Appl. No.: 16/685,121

(22) Filed: Nov. 15, 2019

(65) Prior Publication Data

US 2020/0083161 A1 Mar. 12, 2020

Related U.S. Application Data

(60) Division of application No. 16/231,121, filed on Dec. 21, 2018, now Pat. No. 10,770,389, which is a
(Continued)

(51) Int. Cl.
*H01L 23/522* (2006.01)
*H01L 45/00* (2006.01)
*H01L 23/66* (2006.01)

(52) U.S. Cl.
CPC .......... *H01L 23/5223* (2013.01); *H01L 23/66* (2013.01); *H01L 45/06* (2013.01);
(Continued)

(58) Field of Classification Search
CPC .......... H01L 23/5223; H01L 45/1286
See application file for complete search history.

(56) References Cited

U.S. PATENT DOCUMENTS 6,535,545 B1 3/2003 Ben-Bassat
7,761,067 B1 7/2010 Tsai et al.
(Continued)

FOREIGN PATENT DOCUMENTS

WO WO 2016/028362 2/2016

OTHER PUBLICATIONS

G. Slovin, et al., "Design Criteria in Sizing Phase-Change RF Switches," in *IEEE Transactions on Microwave Theory and Techniques*, vol. 65, No. 11, pp. 4531-4540, Nov. 2017.
(Continued)

*Primary Examiner* — Yu-Hsi D Sun
(74) *Attorney, Agent, or Firm* — Farjami & Farjami LLP

(57) ABSTRACT

A radio frequency (RF) switch includes a phase-change material (PCM), a heating element underlying an active segment of the PCM and extending outward and transverse to the PCM, and RF terminals having lower metal portions and upper metal portions. At least one of the lower metal portions can be ohmically separated from and capacitively coupled to passive segments of the PCM, while the upper metal portions are ohmically connected to the lower metal portions. Alternatively, the lower metal portions can be ohmically connected to passive segments of the PCM, while a capacitor is formed in part by at least one of the upper metal portions. Alternatively, at least one of the RF terminals can have a trench metal liner separated from a trench metal plug by a dielectric liner. The trench metal liner can be ohmically connected to passive segments of the PCM, while the trench metal plug is ohmically separated from, but capacitively coupled to, the trench metal liner.

20 Claims, 9 Drawing Sheets

Related U.S. Application Data continuation-in-part of application No. 16/103,490, filed on Aug. 14, 2018, now Pat. No. 10,476,001, and a continuation-in-part of application No. 16/103,587, filed on Aug. 14, 2018, now Pat. No. 10,461,253, and a continuation-in-part of application No. 16/103,646, filed on Aug. 14, 2018, now Pat. No. 10,475,993, and a continuation-in-part of application No. 16/114,106, filed on Aug. 27, 2018, now Pat. No. 10,707,125.

(52) U.S. Cl.
CPC ........ *H01L 45/126* (2013.01); *H01L 45/1226* (2013.01); *H01L 45/143* (2013.01); *H01L 45/144* (2013.01)

(56) References Cited

U.S. PATENT DOCUMENTS

| | | | |
|---|---|---|---|
| 2,014,181 | A1 | 7/2014 | Moon |
| 9,257,647 | B2 | 2/2016 | Borodulin |
| 9,368,720 | B1* | 6/2016 | Moon ............... H01L 45/1286 |
| 9,917,104 | B1* | 3/2018 | Roizin ............... H01L 27/1203 |
| 10,164,608 | B2 | 12/2018 | Belot |
| 10,461,253 | B1 | 10/2019 | Slovin |
| 10,505,106 | B1 | 12/2019 | Joshi |
| 10,529,922 | B1 | 1/2020 | Howard |
| 2004/0113232 | A1 | 6/2004 | Johnson et al. |
| 2005/0212090 | A1 | 9/2005 | Friedrich et al. |
| 2007/0246766 | A1 | 10/2007 | Liu |
| 2008/0142775 | A1* | 6/2008 | Chen ............... H01L 45/1206 257/4 |
| 2008/0142777 | A1 | 6/2008 | Park |
| 2008/0272355 | A1 | 11/2008 | Cho |
| 2008/0291718 | A1 | 11/2008 | Liu |
| 2009/0065761 | A1 | 3/2009 | Chen |
| 2009/0115052 | A1 | 5/2009 | Treece et al. |
| 2010/0238603 | A1 | 9/2010 | Chung |
| 2010/0246247 | A1 | 9/2010 | Kim |
| 2011/0097825 | A1 | 4/2011 | Cheng |
| 2012/0037872 | A1 | 2/2012 | Ikarashi |
| 2014/0110657 | A1 | 4/2014 | Redaelli |
| 2014/0191181 | A1 | 7/2014 | Moon |
| 2015/0104921 | A1 | 4/2015 | Terai et al. |
| 2016/0056373 | A1 | 2/2016 | Goktepeli |
| 2017/0187347 | A1 | 6/2017 | Rinaldi |
| 2017/0207764 | A1 | 7/2017 | Wang |
| 2018/0005786 | A1 | 1/2018 | Navarro |
| 2018/0138894 | A1 | 5/2018 | Belot |
| 2018/0266974 | A1 | 9/2018 | Khosravani |
| 2019/0088721 | A1 | 3/2019 | Reig |
| 2019/0165264 | A1 | 5/2019 | Wu |
| 2019/0296718 | A1 | 9/2019 | Birkbeck et al. |

OTHER PUBLICATIONS

N. El-Hinnawy et al., "A 7.3 THz Cut-Off Frequency, Inline, Chalcogenide Phase-Change RF Switch Using an Independent Resistive Heater for Thermal Actuation," *2013 IEEE Compound Semiconductor Integrated Circuit Symposium (CSICS)*, Monterey, CA, 2013, pp. 1-4.

G. Slovin, et al. "AlN Barriers for Capacitance Reduction in Phase-Change RF Switches," in *IEEE Electron Device Letters*, vol. 37, No. 5, pp. 568-571, May 2016.

Moon, et al. "Phase-Change RF Switches with Robust Switching Cycle Endurance," *2018 IEEE Radio and Wireless Symposium (RWS)*, pp. 231-233, Jan. 2018, Anaheim, CA.

Wang, et al. "Directly Heated Four-Terminal Phase Change Switches," *2014 IEEE MTT-S International Microwave Symposium (IMS2014)*, pp. 1-4, Jun. 2014, Tampa, FL.

Tombak, et al. "Cellular Antenna Switches for Multimode Applications Based on a Silicon-on-Insulator Technology," *2010 IEEE Radio Frequency Integrated Circuits Symposium (RFIC)*, pp. 271-274, May 2010, Anaheim, CA.

\* cited by examiner

PHASE-CHANGE MATERIAL (PCM) RADIO FREQUENCY (RF) SWITCHES WITH TRENCH METAL PLUGS FOR RF TERMINALS

CLAIMS OF PRIORITY

This is a divisional of application Ser. No. 16/231,121 filed on Dec. 21, 2018. Application Ser. No. 16/231,121 filed on Dec. 21, 2018 ("the parent application") is a continuation-in-part of and claims the benefit of and priority to application Ser. No. 16/103,490 filed on Aug. 14, 2018, titled "Manufacturing RF Switch Based on Phase-Change Material.". The parent application is also a continuation-in-part of and claims the benefit of and priority to application Ser. No. 16/103,587 filed on Aug. 14, 2018, titled "Design for High Reliability RE Switch Based on Phase-Change Material,". The parent application is also a continuation-in-part of and claims the benefit of and priority to application Ser. No. 16/103,646 filed on Aug. 14, 2018, titled "PCM RF Switch Fabrication with Subtractively Formed Heater,". The parent application is further a continuation-in-part of and claims the benefit of and priority to application Ser. No. 16/114,106 filed on Aug. 27, 2018, titled "Fabrication of Contacts in an RF Switch Having a Phase-Change Material (PCM) and a Heating Element,". The disclosures and contents of all of the above-identified applications are hereby incorporated fully by reference into the parent application and the present divisional application.

BACKGROUND

Phase-change materials (PCM) are capable of transforming from a crystalline phase to an amorphous phase. These two solid phases exhibit differences in electrical properties, and semiconductor devices can advantageously exploit these differences. Given the ever-increasing reliance on radio frequency (RF) communication, there is particular need for RF switching devices to exploit phase-change materials. However, the capability of phase-change materials for phase transformation depends heavily on how they are exposed to thermal energy and how they are allowed to release thermal energy. For example, in order to transform into an amorphous state, phase-change materials may need to achieve temperatures of approximately seven hundred degrees Celsius (700° C.) or more, and may need to cool down within hundreds of nanoseconds.

It is sometimes desirable to avoid fabricating ohmic contacts for connecting to RF terminals of an RF switch. In those instances, a robust capacitive (and non-ohmic) contact can be a good choice. However, capacitance fabrication techniques applicable to conventional semiconductor devices may not be optimum for, or easily compatible with, PCM RF switches, and may not properly utilize or take advantage of the unique structure, layout, and geometry of PCM RF switches. As such, fabricating capacitors in PCM RF switches can present significant manufacturing challenges.

Thus, there is a need in the art for capacitive (and non-ohmic) contacts to connect with RF terminals of PCM RF switches while preserving or improving RF performance.

SUMMARY

The present disclosure is directed to phase-change material (PCM) radio frequency (RF) switches with capacitively coupled RF terminals, substantially as shown in and/or described in connection with at least one of the figures, and as set forth in the claims.

DETAILED DESCRIPTION

Figure 1:
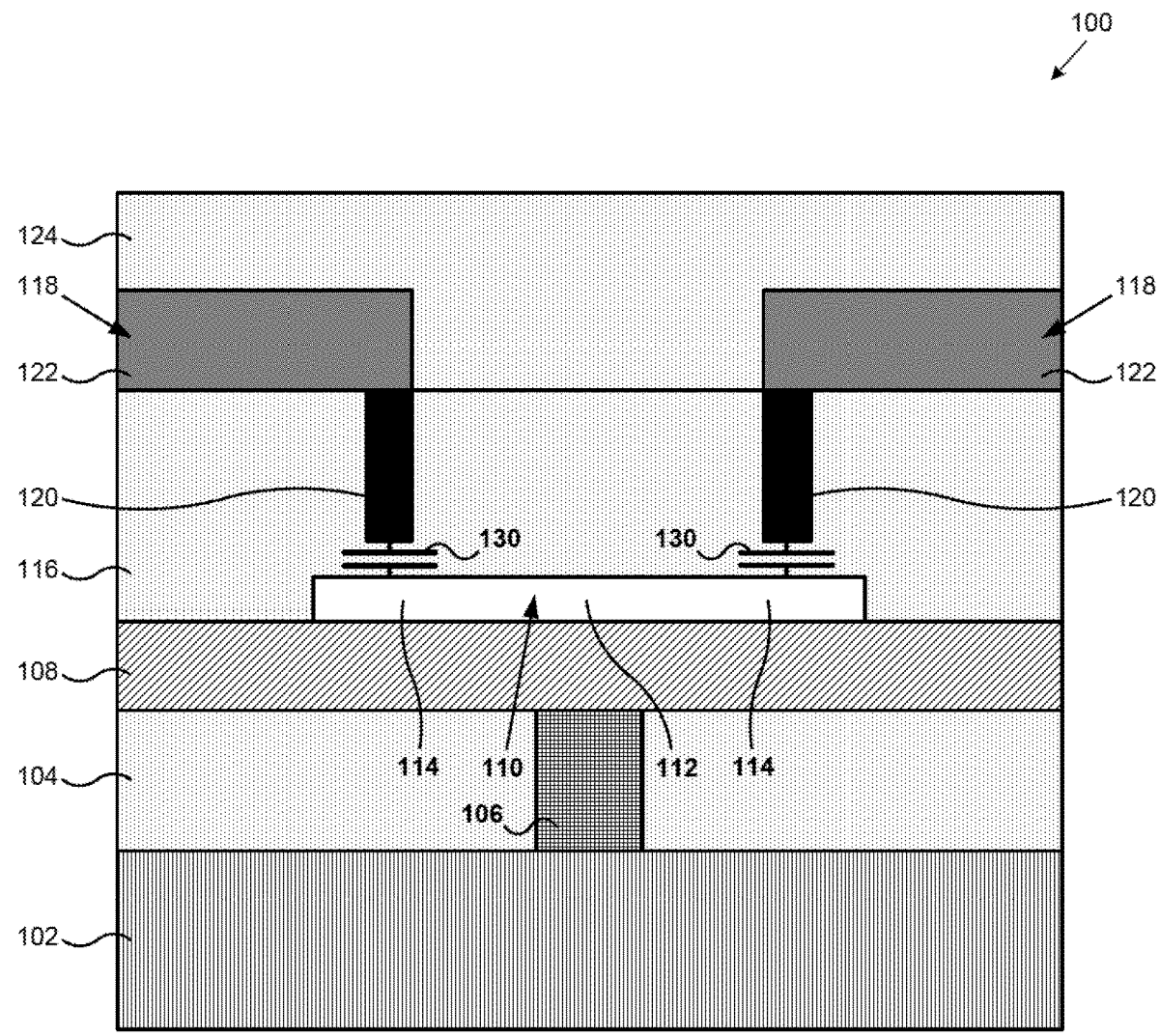
FIG. 1 illustrates a cross-sectional view of a portion of a radio frequency (RF) switch according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates a cross-sectional view of a portion of a phase-change material (PCM) radio frequency (RF) switch according to one implementation of the present application. RF switch 100 shown in FIG. 1 includes substrate 102, lower dielectric 104, heating element 106, thermally conductive and electrically insulating layer 108, PCM 110 having active segment 112 and passive segments 114, RF terminal dielectric segment 116, RF terminals 118 having lower metal portions 120 and upper metal portions 122, upper dielectric 124, and capacitors 130.

Substrate 102 is situated under lower dielectric 104. In one implementation, substrate 102 is an insulator, such as silicon oxide ($SiO_2$). In various implementations, substrate 102 is a silicon (Si), silicon-on-insulator (SOI), sapphire, complementary metal-oxide-semiconductor (CMOS), bipolar CMOS (BiCMOS), or group III-V substrate. In various implementations, a heat spreader is integrated with substrate 102, or substrate 102 itself performs as a heat spreader. Substrate 102 can have additional layers (not shown in FIG.

1). In one implementation, substrate 102 can comprise a plurality of interconnect metal levels and interlayer dielectric layers. Substrate 102 can also comprise a plurality of devices, such as integrated passive elements (not shown in FIG. 1).

Lower dielectric 104 is situated on top of substrate 102, and is adjacent to the sides of heating element 106. In the present implementation, lower dielectric 104 extends along the width of RF switch 100, and is also coplanar with heating element 106. In various implementations, lower dielectric 104 can have a relative width and/or a relative thickness greater or less than shown in FIG. 1. Lower dielectric 104 may comprise a material with thermal conductivity lower than that of thermally conductive and electrically insulating layer 108. In various implementations, lower dielectric 104 can comprise silicon oxide ($SiO_2$), silicon nitride ($Si_XN_Y$), or another dielectric.

Heating element 106 is situated in lower dielectric 104. Heating element 106 also underlies active segment 112 of PCM 110. Heating element 106 generates a crystallizing heat pulse or an amorphizing heat pulse for transforming active segment 112 of PCM 110. Heating element 106 can comprise any material capable of Joule heating. Preferably, heating element 106 comprises a material that exhibits minimal or substantially no electromigration, thermal stress migration, and/or agglomeration. In various implementations, heating element 106 can comprise tungsten (W), molybdenum (Mo), titanium (Ti), titanium nitride (TiN), titanium tungsten (TiW), tantalum (Ta), nickel chromium (NiCr), or nickel chromium silicon (NiCrSi). For example, in one implementation, heating element 106 comprises tungsten lined with titanium and titanium nitride. Heating element 106 may be formed by a damascene process, a subtractive etch process, or any other suitable process. Heating element 106 can be connected to electrodes of a pulse generator (not shown in FIG. 1) that generates a crystallizing current pulse or an amorphizing voltage or current pulses.

Thermally conductive and electrically insulating layer 108 is situated on top of heating element 106 and lower dielectric 104, and under PCM 110 and, in particular, under active segment 112 of PCM 110. Thermally conductive and electrically insulating layer 108 ensures efficient heat transfer from heating element 106 toward active segment 112 of PCM 110, while electrically insulating heating element 106 from RF terminals 118, PCM 110, and other neighboring structures. Thermally conductive and electrically insulating layer 108 can comprise any material with high thermal conductivity and high electrical resistivity. In various implementations, thermally conductive and electrically insulating layer 108 can comprise aluminum nitride (AlN), aluminum oxide ($Al_XO_Y$), beryllium oxide ($Be_XO_Y$), silicon carbide (SiC), diamond, or diamond-like carbon.

PCM 110 is situated on top of thermally conductive and electrically insulating layer 108. PCM 110 also overlies heating element 106. PCM 110 includes active segment 112 and passive segments 114. Active segment 112 of PCM 110 approximately overlies heating element 106 and is approximately defined by heating element 106. Passive segments 114 of PCM 110 extend outward and are transverse to heating element 106, and are situated approximately under RF terminals 118. As used herein, "active segment" refers to a segment of PCM that transforms between crystalline and amorphous states, for example, in response to a crystallizing or an amorphizing heat pulse generated by heating element 106, whereas "passive segment" refers to a segment of PCM that does not make such transformation and maintains a crystalline state (i.e., maintains a conductive state). With proper heat pulses and heat dissipation, active segment 112 of PCM 110 can transform between crystalline and amorphous states, allowing RF switch 100 to switch between ON and OFF states respectively.

PCM 110 can be germanium telluride ($Ge_XTe_Y$), germanium antimony telluride ($Ge_XSb_YTe_Z$), germanium selenide ($Ge_XSe_Y$), or any other chalcogenide. In various implementations, PCM 110 can be germanium telluride having from forty percent to sixty percent germanium by composition (i.e., $Ge_XTe_Y$, where $0.4 \leq X \leq 0.6$ and $Y=1-X$). The material for PCM 110 can be chosen based upon ON state resistivity, OFF state electric field breakdown threshold, crystallization temperature, melting temperature, or other considerations. PCM 110 can be provided, for example, by physical vapor deposition (PVD), sputtering, chemical vapor deposition (CVD), evaporation, or atomic layer deposition (ALD). It is noted that in FIG. 1, current flowing in heating element 106 flows substantially under active segment 112 of PCM 110.

RF terminal dielectric segment 116 is situated over PCM 110 and over thermally conductive and electrically insulating layer 108. In various implementations, RF terminal dielectric segment 116 is $SiO_2$, boron-doped $SiO_2$, phosphorous-doped $SiO_2$, $Si_XN_Y$, or another dielectric. In various implementations, RF terminal dielectric segment 116 is a low-k dielectric, such as fluorinated silicon dioxide, carbon-doped silicon oxide, or spin-on organic polymer. RF terminal dielectric segment 116 can be provided, for example, by plasma enhanced CVD (PECVD), high density plasma CVD (HDP-CVD), or spin-on processes.

Lower metal portions 120 of RF terminals 118 extend partially through RF terminal dielectric segment 116. Notably, lower metal portions 120 do not connect to passive segments 114 of PCM 110. That is, lower metal portions 120 are ohmically separated from passive segments 114 of PCM 110. In one implementation, a metal layer is deposited in and over RF terminal dielectric segment 116, and then planarized with RF terminal dielectric segment 116, for example, using chemical machine polishing (CMP), thereby forming lower metal portions 120. In an alternative implementation, a damascene process is used to form lower metal portions 120. In various implementations, lower metal portions 120 can comprise tungsten (W), aluminum (Al), or copper (Cu). Lower metal portions 120 are part of RF terminals 118 that provide RF signals to and from PCM 110. As described below, lower metal portions 120 are capacitively coupled to passive segments 114 of PCM 110. In an alternative implementation, only one lower metal portion 120 is capacitively coupled to its respective passive segment 114 of PCM 110, while the other lower metal portion 120 is directly and ohmically connected to its respective passive segment 114. As such, only one RF terminal is ohmically separated from and capacitively coupled to a respective passive segment of the PCM, while the other RF terminal is ohmically connected to its respective passive segment of the PCM.

Upper metal portions 122 are situated over RF terminal dielectric segment 116 and over lower metal portions 120. Notably, in the present implementation, upper metal portions 122 are ohmically connected to lower metal portions 120. Together, lower metal portions 120 and upper metal portions 122 make up RF terminals 118 that provide RF signals to and from PCM 110. Upper metal portions 122 are made from an interconnect metal of generally any multi-layer stack of interconnect metals and interlayer dielectrics suitable for semiconductor devices. Upper metal portions 122 facilitate external connections for RF switch 100 and also improve signal handling. In the present implementation, upper metal portions 122 are a first interconnect metal (i.e., M1). In other implementations, upper metal portions 122 may be any other interconnect metal of a multi-level metallization. In one implementation, a first interconnect metal is deposited over RF terminal dielectric segment 116 and over lower metal portions 120, and then a middle segment thereof overlying active segment 112 is patterned, thereby forming upper metal portions 122. In an alternative implementation, a damascene process is used to form upper metal portions 122. In various implementations, upper metal portions 122 can comprise W, Al, or Cu. In one implementation, lower metal portions 120 can comprise W, and upper metal portions 122 can comprise Al or Cu. Although lower metal portions 120 and upper metal portions 122 are aligned in FIG. 1, in various implementations, upper metal portions 122 can have an offset towards active segment 112 of PCM 110 or can have an offset away from active segment 112 of PCM 110.

Upper dielectric 124 is situated on top of upper metal portions 122 and RF terminal dielectric segment 116. Upper dielectric 124 is an interlayer dielectric of generally any multi-layer stack of interconnect metals and interlayer dielectrics suitable for semiconductor devices. Upper dielectric 124 provides insulation for upper metal portions 122. In the present implementation, upper dielectric 124 is the top interlayer dielectric. In various implementations, RF switch 100 can include more interconnect metal levels and/or more interlayer dielectrics than shown in FIG. 1. In various implementations, upper dielectric 124 can comprise $SiO_2$, silicon nitride, or another dielectric.

Because passive segments 114 of PCM 110 maintain a conductive crystalline state, capacitors 130 are formed by passive segments 114 of PCM 110, RF terminal dielectric segment 116, and lower metal portions 120 of RF terminals 118. Capacitors 130 capacitively couple lower metal portions 120 to passive segments 114, creating part of an RF signal path of RF switch 100, despite that lower metal portions 120 and passive segments 114 are ohmically separated from each other.

Figure 2:
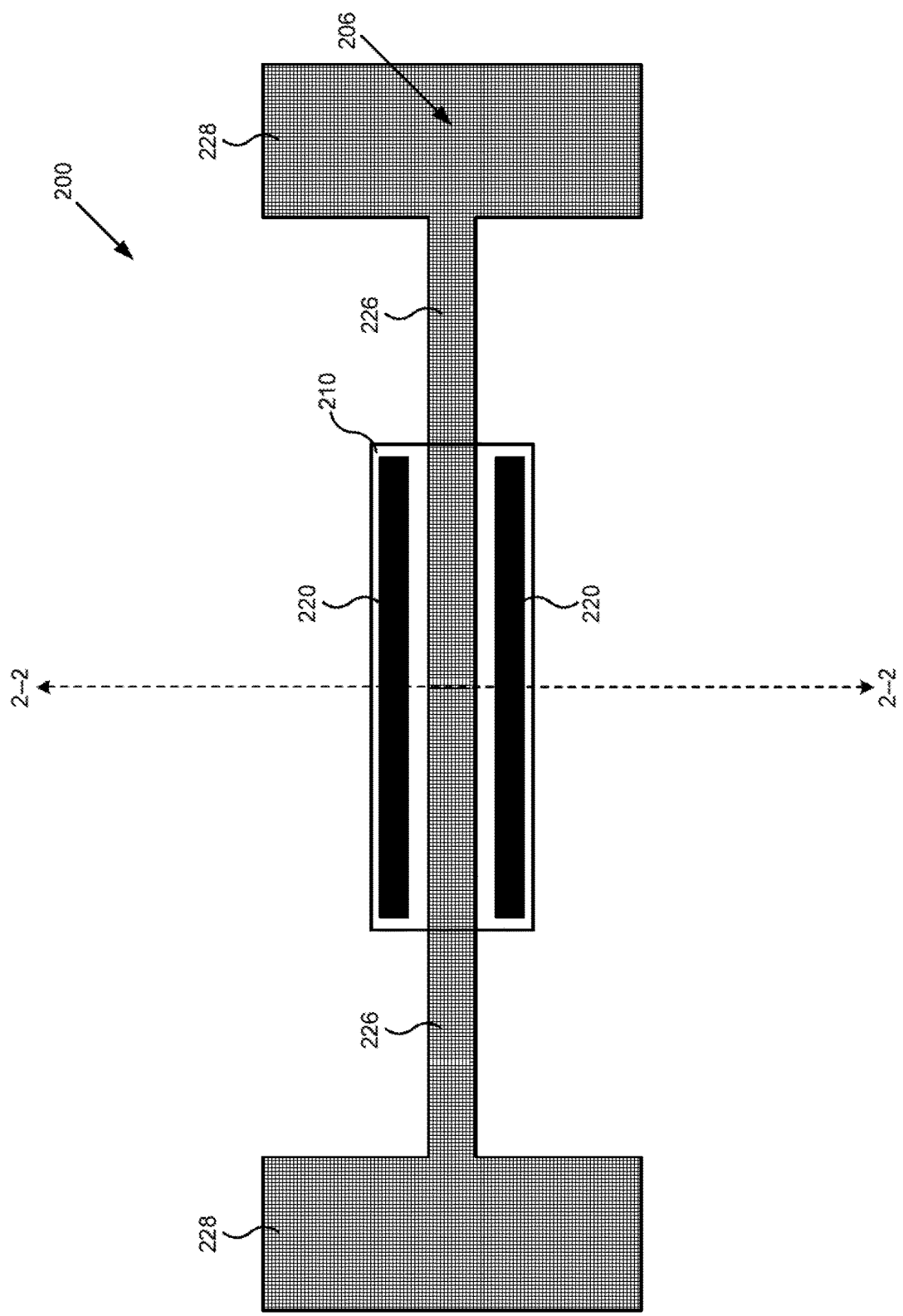
FIG. 2 illustrates a top view of a portion of an RF switch according to one implementation of the present application.

FIG. 2 illustrates a top view of a portion of an RF switch according to one implementation of the present application. FIG. 1 illustrates a cross-sectional view along line "2-2" in FIG. 2. RF switch 200 includes heating element 206 having heater line 226 and heater contacts 228, PCM 210, and lower metal portions 220 of RF terminals. For purposes of illustration, the top view in FIG. 2 shows selected structures. RF switch 200 may include other structures not shown in FIG. 2.

Heating element 206 extends along RF switch 200 transverse to PCM 210, and includes heater line 226 and heater contacts 228. Heater line 226 is approximately centered along heating element 206. Heater line 226 underlies PCM 210, and is seen through PCM 210. Heater contacts 228 are situated at the two ends of heating element 206. In the present implementation, heater contacts 228 occupy a relatively a large area. In other implementations, heater contacts 228 may have any other size or shape. Heater contacts 228 provide for connection of, for example, a voltage or current pulse generator (not shown in FIG. 2) to heater line 226. Heater line 226 provides Joule heating for converting current pulses into heat pulses. In FIG. 2, heating element 206 generates a crystallizing or an amorphizing heat pulse for transforming an active segment of PCM 210, as described above. Heating element 206 in FIG. 2 generally corresponds to heating element 106 in FIG. 1 and may have any implementations and advantages described above.

PCM 210 in FIG. 2 generally corresponds to PCM 110 in FIG. 1 and may have any implementations and advantages described above. In response to a crystallizing or an amorphizing heat pulse generated by heating element 206, an active segment of PCM 210 can transform from a crystalline phase that easily conducts electrical current to an amorphous phase that does not easily conduct electrical current and, thus, can transform the state of RF switch 200 to an ON state or an OFF state, as described above.

Lower metal portions 220 of RF terminals are coupled to passive segments of PCM 210. According to the implementation of FIG. 1, lower metal portions 220 of RF terminals would be capacitively coupled to passive segments of PCM 210. In other implementations, lower metal portions 220 of RF terminals can be ohmically connected to passive segments of PCM 210, as described below. Lower metal portions 220 of RF terminals provide RF signals to and from PCM 210. In various implementations, lower metal portions 220 of RF terminals can comprise W, Al, or Cu.

Figure 3:
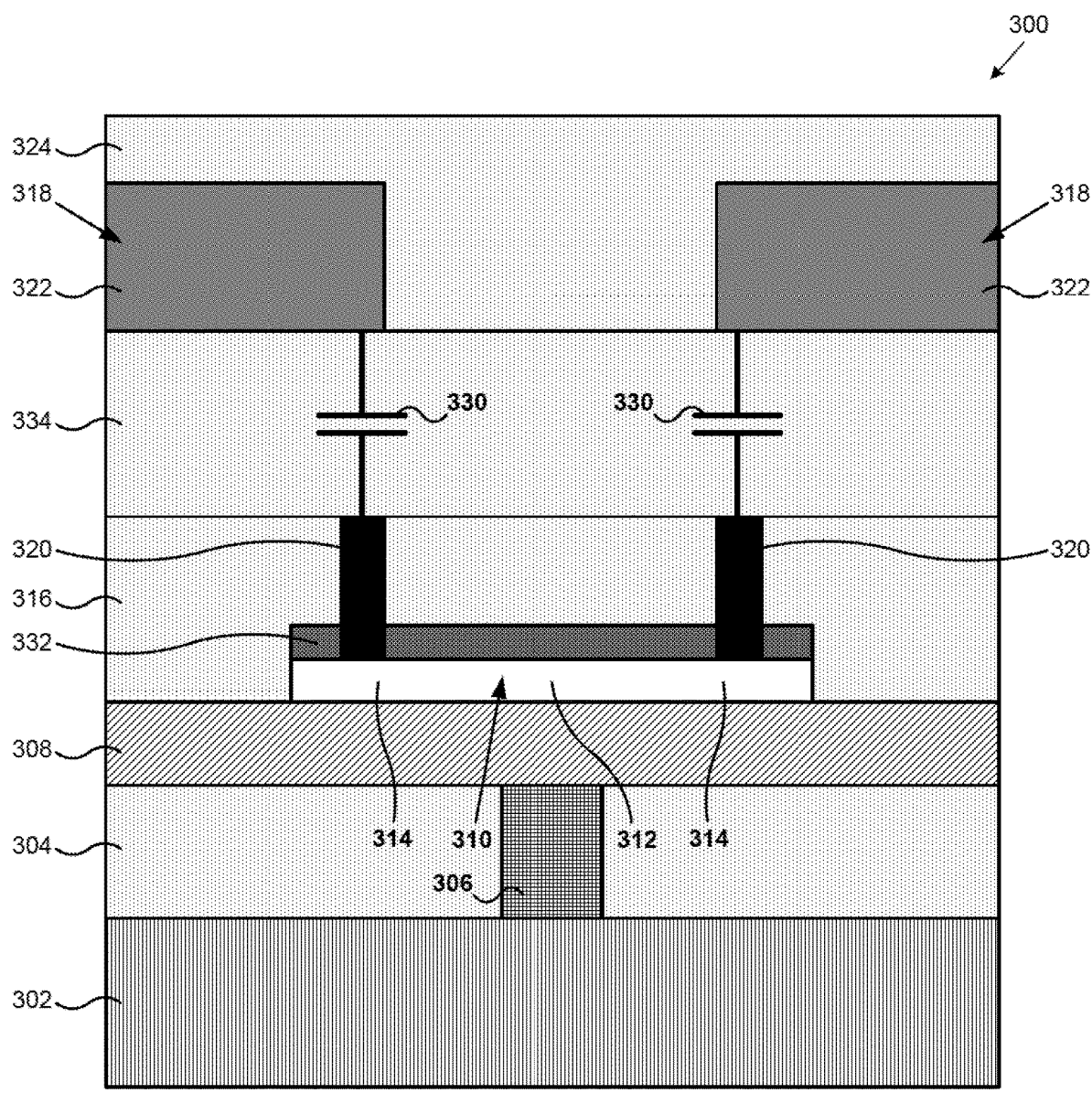
FIG. 3 illustrates a cross-sectional view of a portion of an RF switch according to one implementation of the present application.

FIG. 3 illustrates a cross-sectional view of a portion of an RF switch according to one implementation of the present application. FIG. 3 can represent a cross-sectional view along line "2-2" in FIG. 2. RF switch 300 includes substrate 302, lower dielectric 304, heating element 306, thermally conductive and electrically insulating layer 308, PCM 310 having active segment 312 and passive segments 314, optional contact uniformity support layer 332, RF terminal dielectric segment 316, RF terminals 318 having lower metal portions 320 and upper metal portions 322, pre-metal dielectric 334, upper dielectric 324, and metal-oxide-metal (MOM) capacitors 330. Substrate 302, lower dielectric 304, heating element 306, thermally conductive and electrically insulating layer 308, PCM 310 having active segment 312 and passive segments 314, RF terminal dielectric segment 316, and upper dielectric 324 in RF switch 300 in FIG. 3 are similar to corresponding structures in RF switch 100 in FIG. 1, and may have any implementations and advantages described above.

In RF switch 300, optional contact uniformity support layer 332 is situated over PCM 310. In one implementation, optional contact uniformity support layer 332 comprises $Si_xN_y$. In another implementation optional contact uniformity support layer 332 is a bi-layer that comprises oxide and nitride, such as $SiO_2$ under $Si_xN_y$. Optional contact uniformity support layer 332 can be provided, for example, by PECVD or HDP-CVD. RF terminal dielectric segment 316 is situated over optional contact uniformity support layer 332. Otherwise, RF terminal dielectric segment 316 in FIG. 3 generally corresponds to RF terminal dielectric segment 116 in FIG. 1.

Lower metal portions 320 of RF terminals 318 extend through RF terminal dielectric segment 316 and through optional contact uniformity support layer 332 (in case optional contact uniformity support layer 332 is used). In contrast to lower metal portions 120 in FIG. 1, lower metal portions 320 in FIG. 3 are ohmically connected to passive segments 314 of PCM 310. In the present implementation, forming lower metal portions 320 of RF terminals 318 may comprise two different etching actions. In the first etching action, RF terminal dielectric segment 316 can be aggressively etched without having to accurately time the etching action. This etching action can use a selective etch, for example, a fluorine-based plasma dry etch, and optional contact uniformity support layer 332 can perform as an etch stop while RF terminal dielectric segment 316 is selectively etched.

In the second etching action, optional contact uniformity support layer 332 is punch-through etched. As used herein, "punch-through" refers to a short etching action that can be accurately timed to stop at the top surface of PCM 310. In RF switch 300, lower metal portions 320 are narrow and optional contact uniformity support layer 332 is thin. Thus, only a small volume of optional contact uniformity support layer 332 is etched, and the punch-through etching action is short and can be accurately timed. In one implementation, a chlorine-based plasma dry etch is used for this etching action. Optional contact uniformity support layer 332 is optional in that the inventive concepts of the present application may be implemented without optional contact uniformity support layer 332, and lower metal portions 320 can extend through RF terminal dielectric segment 316 into PCM 310. Because the ON state resistance ($R_{ON}$) of RF switch 300 depends heavily on the uniformity of contact made between lower metal portions 320 and PCM 310, the $R_{ON}$ will be significantly lower when optional contact uniformity support layer 332 is used.

Pre-metal dielectric 334 is situated over RF terminal dielectric segment 316 and over lower metal portions 320. Pre-metal dielectric 334 aids formation of upper metal portions 322 of RF terminals 318 and processing of interconnect metals in a multi-level metallization. In various implementations, pre-metal dielectric 334 can comprise borophosphosilicate glass (BPSG), tetra-ethyl ortho-silicate (TEOS), silicon onynitride ($SiO_xN_y$), $SiO_2$, $Si_xN_y$, or another dielectric.

Upper metal portions 322 of RF terminals 318 are situated over pre-metal dielectric 334 and in upper dielectric 324. In the present implementation, upper metal portions 322 are a first interconnect metal (i.e., M1). In other implementations, upper metal portions 322 may be any other interconnect metal of a multi-level metallization. Notably, upper metal portions 322 do not physically connect to lower metal portions 320. That is, upper metal portions 322 are ohmically separated from lower metal portions 320. Otherwise, upper metal portions 322 in FIG. 3 generally correspond to upper metal portions 122 in FIG. 1.

MOM capacitors 330 are formed by lower metal portions 320 of RF terminals 318, pre-metal dielectric 334, and upper metal portions 322 of RF terminals 318. MOM capacitors 330 capacitively couple upper metal portions 322 to lower metal portions 320, creating part of an RF signal path of RF switch 300, despite the fact that upper metal portions 322 and lower metal portions 320 are ohmically separated from each other. MOM capacitors 330 in FIG. 3 are formed farther away from PCM 310 along the RF signal path, relative to capacitors 130 in FIG. 1. In an alternative implementation, only one MOM capacitor 330 is formed by a respective lower metal portion 320 of a respective RF terminal 318, pre-metal dielectric 334, and upper metal portion 322. In this alternative implementation, the other lower metal portion 320 is directly and ohmically connected to its respective upper metal portion 322. The direct connection can be formed using standard CMOS via damascene processes. As such, only one RF terminal 318 is capacitively coupled to a respective passive segment 314 of PCM 310, while the other RF terminal 318 is ohmically connected to its respective passive segment 314 of PCM 310.

Figure 4:
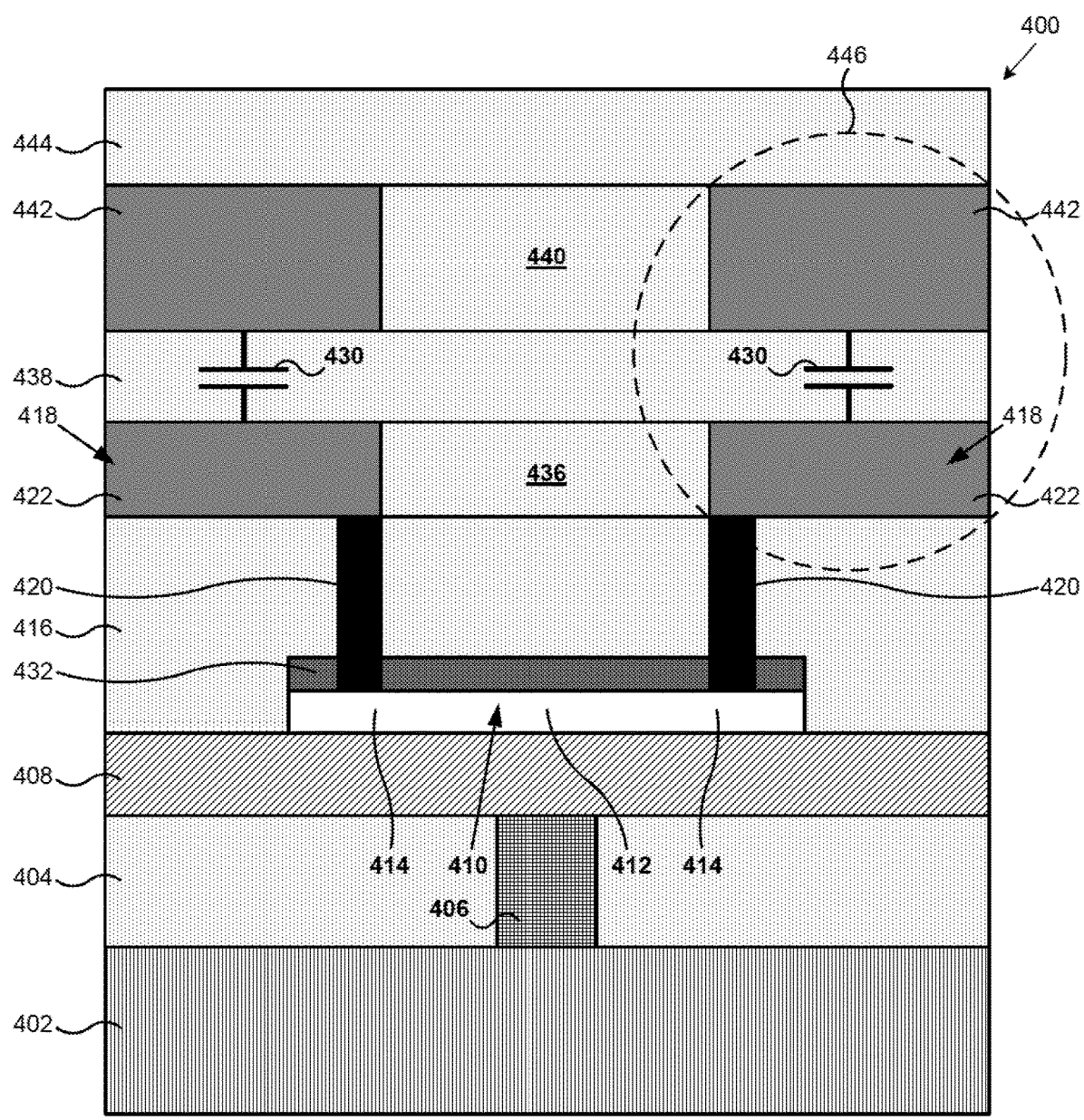
FIG. 4 illustrates a cross-sectional view of a portion of an RF switch according to one implementation of the present application.

FIG. 4 illustrates a cross-sectional view of a portion of an RF switch according to one implementation of the present application. FIG. 4 can represent a cross-sectional view along line "2-2" in FIG. 2. RF switch 400 includes substrate 402, lower dielectric 404, heating element 406, thermally conductive and electrically insulating layer 408, PCM 410 having active segment 412 and passive segments 414, optional contact uniformity support layer 432, RF terminal dielectric segment 416, RF terminals 418 having lower metal portions 420 and upper metal portions 422, interlayer metal levels 436 and 440, interlayer dielectrics 438 and 444, interconnect metals 442, and MOM capacitors 430. Substrate 402, lower dielectric 404, heating element 406, thermally conductive and electrically insulating layer 408, PCM 410 having active segment 412 and passive segments 414, optional contact uniformity support layer 432, and RF terminal dielectric segment 416 in RF switch 400 in FIG. 4 are similar to corresponding structures in RF switch 300 in FIG. 3, and may have any implementations and advantages described above.

In RF switch 400, interlayer metal level 436, interlayer dielectric 438, interlayer metal level 440, and interlayer dielectric 444 are sequentially situated over RF terminal dielectric segment 416. Interlayer metal levels 436 and 440 provide layers in which interconnect metals can be built. Interlayer dielectrics 438 and 444 provide insulation between interlayer metal levels 436 and 440. In the present implementation, interlayer metal level 440 is the top interlayer metal level. In various implementations, RF switch 400 can include more interlayer metal levels and/or more interlayer dielectrics than shown in FIG. 4.

Upper metal portions 422 are situated in interlayer metal level 436 over RF terminal dielectric segment 416 and over lower metal portions 420. In the present implementation, upper metal portions 422 are a first interconnect metal (i.e., M1). In other implementations, upper metal portions 422 may be any other interconnect metal of a multi-level metallization. Notably, upper metal portions 422 are ohmically connected to lower metal portions 420.

Interconnect metals 442 are situated in interlayer metal level 440 over interlayer dielectric 438. In the present implementation, interconnect metals 442 are a second interconnect metal (i.e., M2). In other implementations, interconnect metals 442 may be any other interconnect metal of a multi-level metallization. Notably, interconnect metals 442 are ohmically separated from upper metal portions 422.

MOM capacitors 430 are formed by upper metal portions 422 of RF terminals 418, interlayer dielectric 438, and interconnect metals 442. MOM capacitors 430 capacitively couple interconnect metals 442 to upper metal portions 422, creating part of an RF signal path of RF switch 400, despite the fact that interconnect metals 442 and upper metal portions 422 are ohmically separated from each other. As described above, lower metal portions 420 are narrow in order to punch-through etch optional contact uniformity layer 432. Narrower lower metal portions 420 also decrease parasitic capacitive coupling to heating element 406. In FIG. 3, because lower metal portions 320 are narrow, small misalignment of lower metal portions 320 or upper metal portions 322 can impact the value of MOM capacitors 330. In FIG. 4, MOM capacitors 430 are formed farther away from heating element 406, decreasing parasitic capacitive coupling to heating element 406, and allowing for wider upper metal portions 422 and wider interconnect metals 442. When upper metal portions 422 and interconnect metals 442 are wider, misalignment of upper metal portions 422 and interconnect metals 442 has less impact on the value of MOM capacitors 430. Thus, RF switch 400 affords some tolerance for misalignment. Additionally, because MOM capacitors 430 are formed by interconnect metals 422 and 442 and interlayer dielectric 438, MOM capacitors 430 are easily integrated in multi-level metallization. In an alternative implementation, only one MOM capacitor 430 is formed by a respective interconnect metal 422 of a respective RF terminal 418, interlayer dielectric 438, and interconnect metal 442. In this alternative implementation, the other interconnect metal 422 is directly and ohmically connected to its respective interconnect metal 442. The direct connection can be formed using standard CMOS via damascene processes. As such, only one RF terminal 418 is capacitively coupled to a respective passive segment 414 of PCM 410, while the other RF terminal 418 is ohmically connected to its respective passive segment 414 of PCM 410.

Figure 5A:
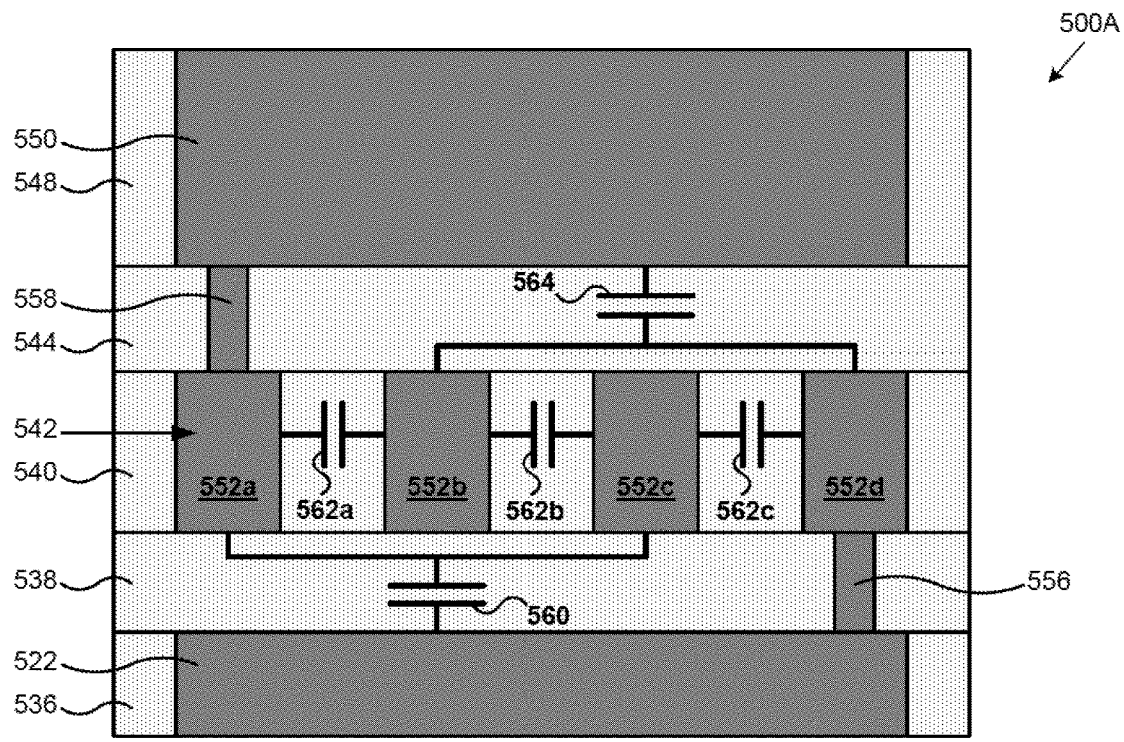
FIG. 5A illustrates a cross-sectional view of a portion of a metal-oxide-metal (MOM) capacitor structure for use in one implementation of the present application.

FIG. 5A illustrates a cross-sectional view of a portion of a MOM capacitor structure according to one implementation of the present application. FIG. 5A represents a MOM capacitor structure that can be used instead of the structure shown in outline 446 in FIG. 4. MOM capacitor structure 500A includes interlayer metal levels 536, 540, and 548, interlayer dielectrics 538 and 544, interconnect metals 522, 542, and 550, fingers 552a, 552b, 552c, and 552d, vias 556 and 558, and capacitors 560, 562a, 562b, 562c, and 564.

In FIG. 5A, interconnect metal 522 is a first interconnect metal situated in interlayer metal level 536. Interlayer dielectric 538 is situated above interconnect metal 522 and interlayer metal level 536. Interconnect metal 542 is a second interconnect metal situated in interlayer metal level 540 above interlayer dielectric 538. Interconnect metal 542 has fingers 552a, 552b, 552c, and 552d. In other implementations, interconnect metal 542 can have more or fewer fingers than shown in FIG. 5A. In the cross sectional view of FIG. 5A, fingers 552a, 552b, 552c, and 552d are substantially rectangular and approximately equally spaced from one another in interlayer metal level 540. In various implementations, fingers 552a, 552b, 552c, and 552d can have different shapes and/or spacing than shown in FIG. 5A. Interlayer dielectric 544 is situated above interconnect metal 542 and interlayer metal level 540. Interconnect metal 550 is a third interconnect metal situated in interlayer metal level 548 above interlayer dielectric 544.

Via 556 extends through interlayer dielectric 538, connecting interconnect metal 522 to interconnect metal 542 (and more specifically to finger 552d). As described below, fingers 552b and 552d are connected to each other. Thus, interconnect metal 522, via 556, and fingers 552b and 552d together form one node. Likewise, via 558 extends through interlayer dielectric 544, connecting interconnect metal 542 (and more specifically finger 552a) to interconnect metal 550. As described below, fingers 552a and 552c are connected to each other. Thus, interconnect metal 550, via 558, and fingers 552a and 552c together form another node.

Capacitor 560 is formed by interconnect metal 522, interlayer dielectric 538, and interconnect metal 542. Capacitor 560 represents a combination of a capacitors formed between interconnect metal 522 and finger 552a, and between interconnect metal 522 and finger 552c. Capacitors 562a. 562b, and 562c are formed between adjacent fingers of interconnect metal 542. Specifically, capacitor 562a is formed between fingers 552a and 552b, capacitor 562b is formed between fingers 552b and 552c, and capacitor 562c is formed between fingers 552c and 552d. Capacitor 564 is formed by interconnect metal 542, interlayer dielectric 544, and interconnect metal 550. Capacitor 564 represents a combination of a capacitors formed between interconnect metal 550 and finger 552b, and between interconnect metal 550 and finger 552d. MOM capacitor structure 500A utilizes areas below, between, and above interconnect metal 542 to form capacitors 560, 562a, 562b, 562c, and 564 between two nodes. When these nodes are used in the RF signal path for an RF switch, such as in outline 446 in FIG. 4, MOM capacitor structure 500A increases the capacitance value of capacitors integrated in the RF terminals of the RF switch.

Figure 5B:
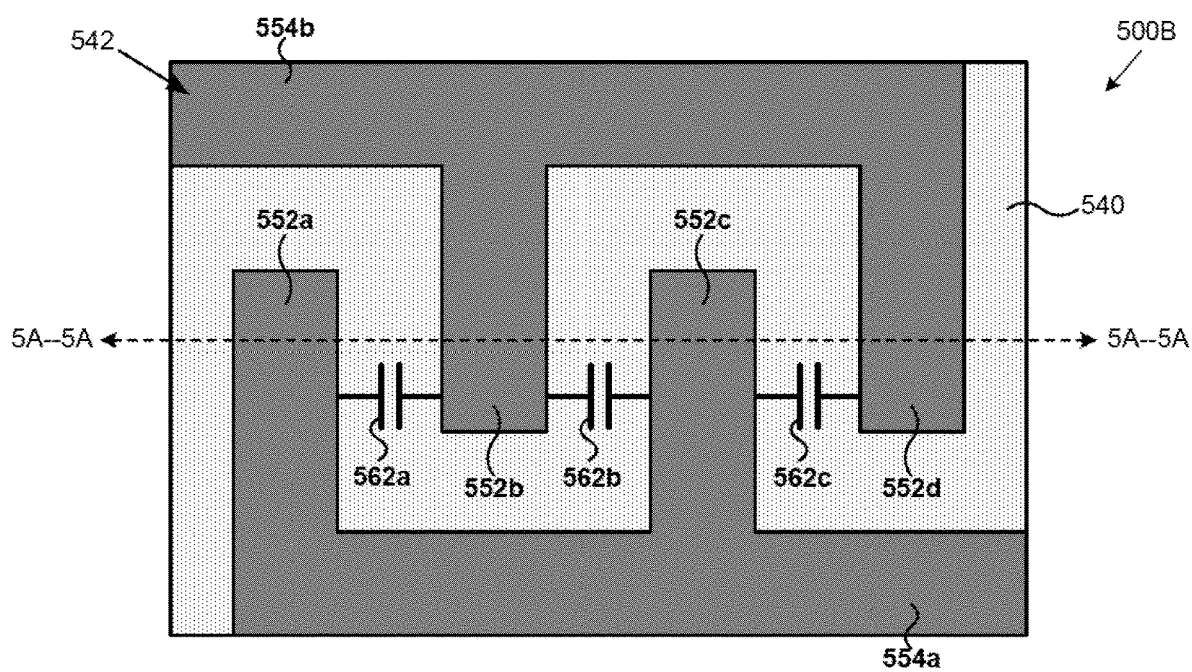
FIG. 5B illustrates a top view of a portion of a MOM capacitor structure corresponding to the MOM capacitor structure of FIG. 5A.

FIG. 5B illustrates a top view of a portion of a MOM capacitor structure corresponding to the MOM capacitor structure of FIG. 5A according to one implementation of the present application. FIG. 5A illustrates a cross-sectional view along line "5A-5A" in FIG. 5B. MOM capacitor structure 500B includes interlayer metal level 540, interconnect metal 542 having fingers 552a, 552b, 552c, and 552d and runners 554a and 554b, and capacitors 562a, 562b, and 562c. Interlayer metal level 540, interconnect metal 542 having fingers 552a, 552b, 552c, and 552d, and capacitors 562a, 562b, and 562c in FIG. 5B correspond to similarly labeled structures in FIG. 5A.

In MOM capacitor structure 500B, fingers 552b and 552d are connected to each other by runner 554b. Thus, runner 554b and fingers 552b and 552d are parts of the same node. Likewise, fingers 552a and 552c are connected to each other by runner 554a. Thus, runner 554a and fingers 552a and 552c are parts of another node. In various implementations runners 554a and 554b may connect additional fingers. Finger 552b, finger 552d, and/or runner 554b may connect to a lower interconnect metal through a via, such as via 556 in FIG. 5A. Likewise, finger 552a, finger 552c, and/or runner 554a may connect to a higher interconnect metal through a via, such as via 558 in FIG. 5A.

As shown in FIG. 5B, the fingers of interconnect metal 542 are interdigitated. Capacitors 562a, 562b, and 562c are formed between adjacent fingers of interconnect metal 542. More specifically, capacitor 562a is formed between fingers 552a and 552b, capacitor 562b is formed between fingers 552b and 552c, and capacitor 562c is formed between fingers 552c and 552d. Although not explicitly labeled in FIG. 5B, it is noted that capacitors are also formed between runner 554a and finger 552b, between runner 554a and finger 552d, between runner 554b and finger 552a, and between runner 554b and finger 552c. When the nodes of interconnect metal 542 are used in the RF signal path for an RF switch, such as in outline 446 in FIG. 4, MOM capacitor structure 500B increases the capacitance value of capacitors integrated in the RF terminals of the RF switch.

Figure 6:
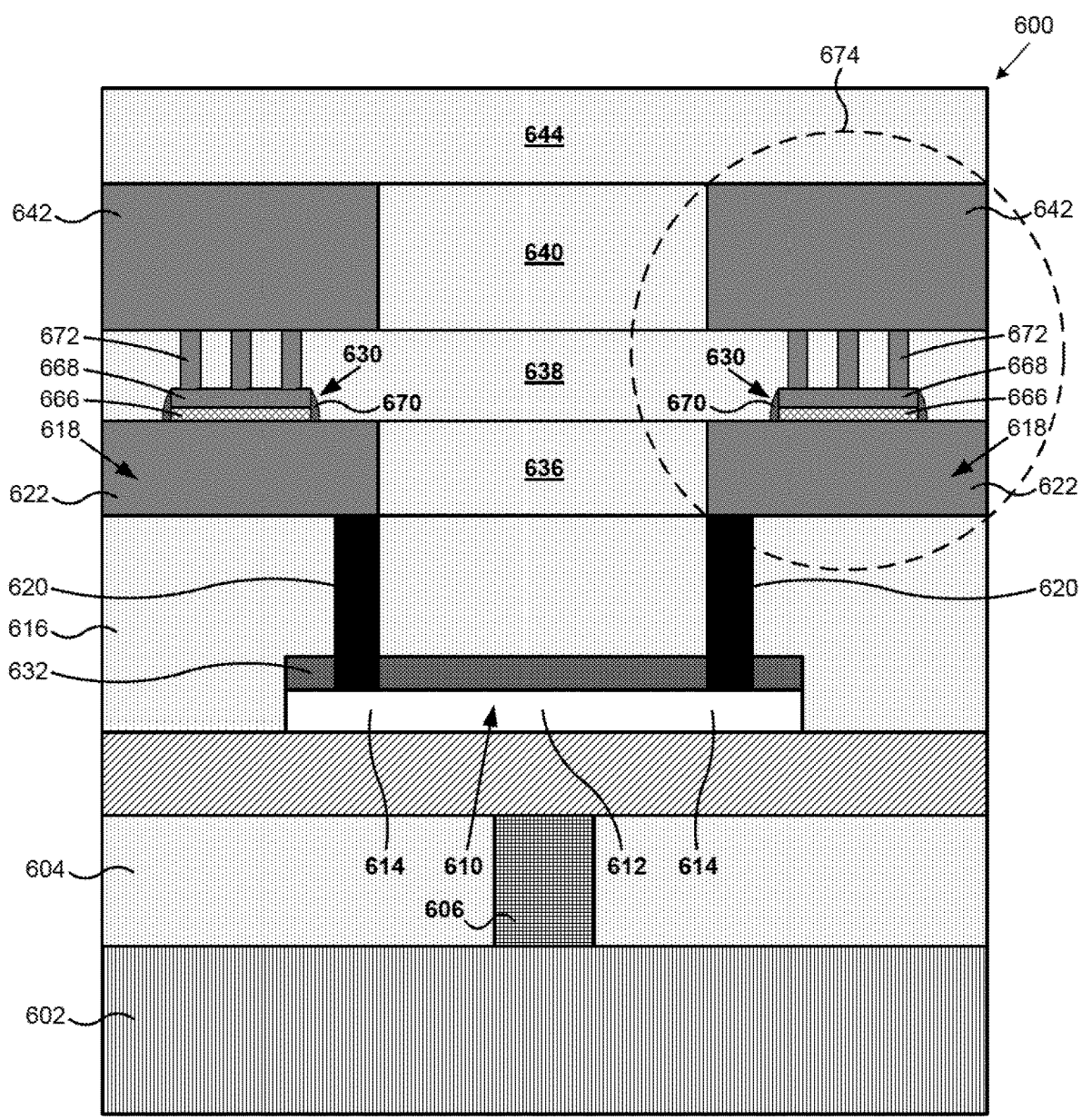
FIG. 6 illustrates a cross-sectional view of a portion of an RF switch according to one implementation of the present application.

FIG. 6 illustrates a cross-sectional view of a portion of an RF switch according to one implementation of the present application. FIG. 6 can represent a cross-sectional view along line "2-2" in FIG. 2. RF switch 600 includes substrate 602, lower dielectric 604, heating element 606, thermally conductive and electrically insulating layer 608, PCM 610 having active segment 612 and passive segments 614, optional contact uniformity support layer 632, RF terminal dielectric segment 616, RF terminals 618 having lower metal portions 620 and upper metal portions 622, interlayer metal levels 636 and 640, interlayer dielectrics 638 and 644, interconnect metals 642, metal-insulator-metal (MIM) capacitors 630 having insulating films 666 and top MIM metals 668, spacers 670, and vias 672. Substrate 602, lower dielectric 604, heating element 606, thermally conductive and electrically insulating layer 608, PCM 610 having active segment 612 and passive segments 614, optional contact uniformity support layer 632, RF terminal dielectric segment 616. RF terminals 618 having lower metal portions 620 and upper metal portions 622, interlayer metal levels 636 and 640, interlayer dielectrics 638 and 644, and interconnect metals 642 in RF switch 600 in FIG. 6 are similar to corresponding structures in RF switch 400 in FIG. 4, and may have any implementations and advantages described above.

In RF switch 600, insulating films 666 are situated on upper metal portions 622. In various implementations, insulating films 666 are high-k dielectrics, such as tantalum pentoxide, aluminum oxide, hafnium oxide, zirconium oxide, zirconium aluminum silicate, hafnium silicate, hafnium aluminum silicate or other dielectrics with a relatively high dielectric constant. In one implementation, the thickness of insulating films 666 can range from approximately two hundred angstroms to approximately six hundred angstroms (200 Å-600 Å).

Top MIM metals 668 are situated over insulating films 666. Top MIM metals 668 can comprise, for example, titanium nitride, tantalum nitride, or a stack comprising aluminum and titanium nitride or tantalum nitride. In one implementation, the thickness of top MIM metals 668 can range from approximately one thousand angstroms to approximately three thousand angstroms (1,000 Å-3,000 Å). Top MIM metals 668 can be provided, for example, by PVD or CVD techniques. It is noted that, unlike interconnect metals 642, top MIM metals 668 are not formed in interlayer metal levels, such as interlayer metal levels 636 and 640. As used herein, "MIM capacitor" refers to a capacitor having a top metal formed within an interlayer dielectric where conventionally no metal exists, such as within interlayer dielectric 638.

Spacers 670 are situated adjacent to the sidewalls of insulating films 666 and top MIM metals 668 of MIM capacitors 630. In various implementations, spacers 670 can comprise $Si_xN_y$, or another dielectric. Spacers 670 protect the sidewalls of insulating films 666 from aggressive etch chemistry used to etch metals during fabrication of RF switch 600. Thus, there is no increase in leakage current of MIM capacitors 630 or decrease in the breakdown voltage of MIM capacitors 630 due to an increase in defects or voids within insulating films 666. As such the capacitance value of MIM capacitors 630 is more precisely controlled, and RF switch 600 is more reliable.

Vias 672 connect top MIM metals 668 of MIM capacitors 630 to interconnect metals 642. Thus, for each of MIM capacitors 630, top MIM metal 668, vias 672, and interconnect metals 642 together form one node. In various implementations, each of MIM capacitors 630 can be connected by more or fewer vias than shown in FIG. 6. Notably, because top MIM metals 668 are within interlayer dielectric 638, vias 672 only extend partially through interlayer dielectric 638.

MIM capacitors 630 formed by upper metal portions 622, insulating films 666, and top MIM metals 668 have a capacitance with significantly improved density. MIM capacitors 630 do not require addition of interlayer metal levels, such as interlayer metal level 548 in FIG. 5A, and also do not use up lateral die space. MIM capacitors 630 advantageously increase routing capability because MIM capacitors 630 utilize the space amply available between interlayer metal levels 636 and 640.

In an alternative implementation, only one MIM capacitor 630 is formed by a respective upper metal portion 622 of a respective RF terminal 618, insulating film 666, and top MIM metal 668 connected to a respective interconnect metal 642. In this alternative implementation, the other interconnect metal 642 is directly and ohmically connected to its respective upper metal portion 622 without using a MIM capacitor. The direct connection can be formed using standard CMOS via damascene processes. As such, only one RF terminal 618 is capacitively coupled to a respective passive segment 614 of PCM 610, while the other RF terminal 618 is ohmically connected to its respective passive segment 614 of PCM 610.

Figure 7:
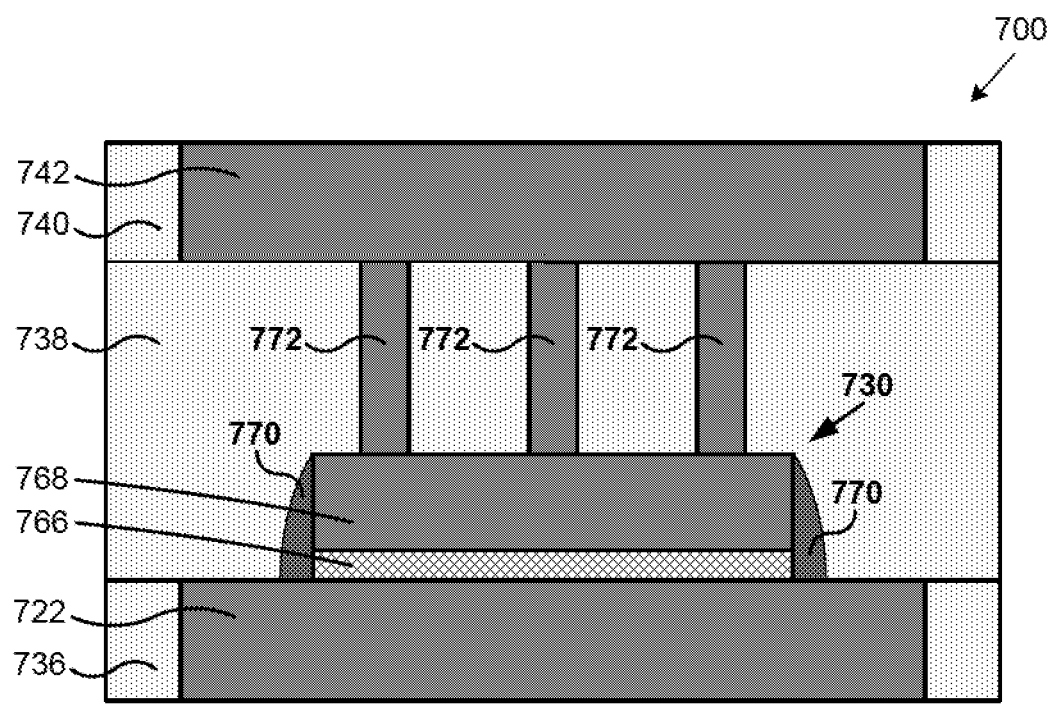
FIG. 7 illustrates a cross-sectional view of a portion of a metal-insulator-metal (MIM) capacitor structure for use in one implementation of the present application.

FIG. 7 illustrates a cross-sectional view of a portion of a metal-insulator-metal (MIM) capacitor structure according to one implementation of the present application. FIG. 7 represents a closer view of the structure shown in outline 674 in FIG. 6. MIM capacitor structure 700 includes upper metal portion 722, interlayer metal levels 736 and 740, interlayer dielectric 738, interconnect metal 742, MIM capacitor 730 having insulating film 766 and top MIM metal 768, spacers 770, and vias 772. Upper metal portions 722, interlayer metal levels 736 and 740, interlayer dielectric 738, interconnect metal 742, MIM capacitor 730 having insulating film 766 and top MIM metal 768, spacers 770, and vias 772 in MIM capacitor structure 700 in FIG. 7 are similar to corresponding structures in RF switch 600 in FIG. 6, and may have any implementations and advantages described above.

Figure 8:
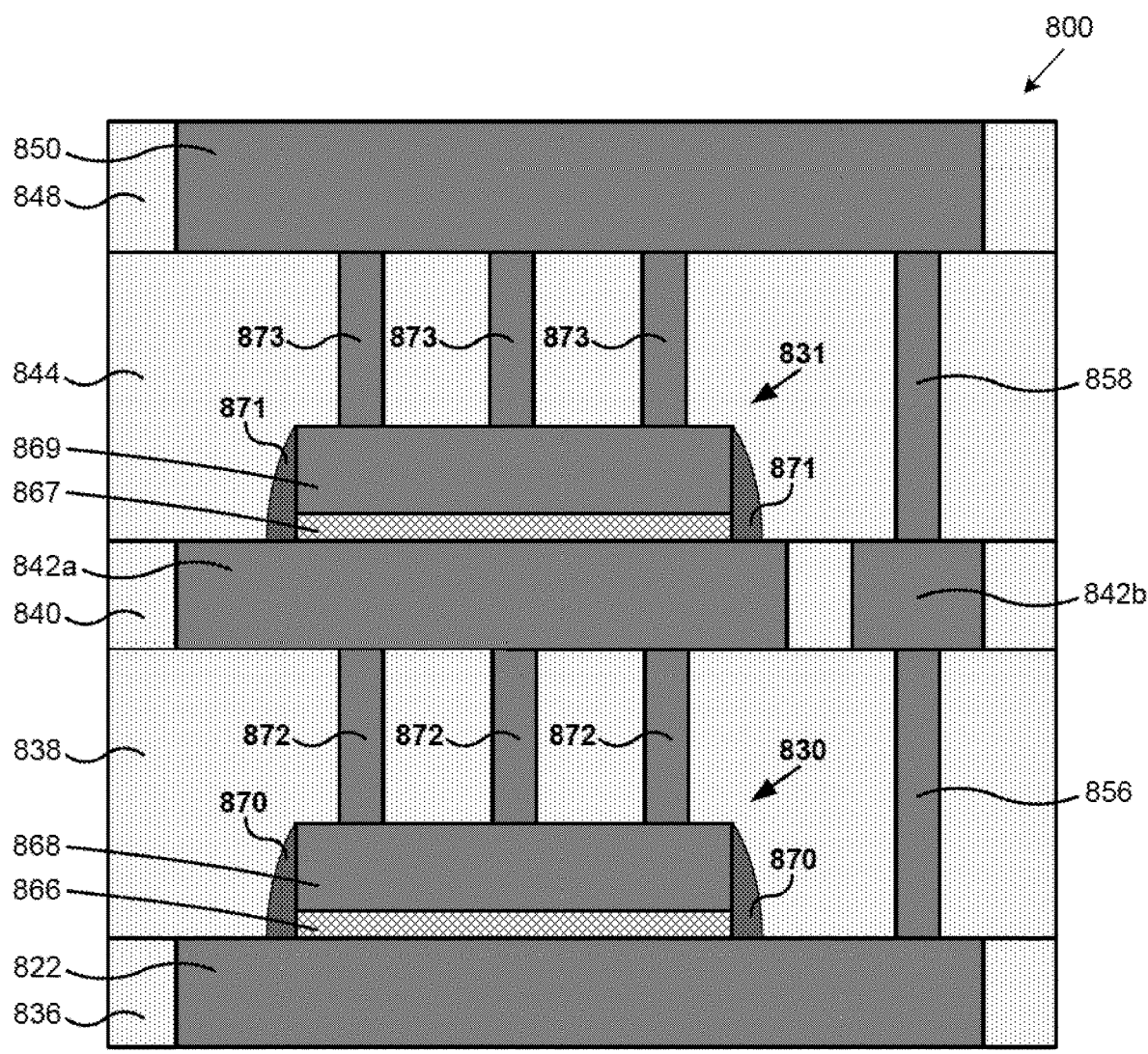
FIG. 8 illustrates a cross-sectional view of a portion of a stacked MIM capacitor structure for use in one implementation of the present application.

FIG. 8 illustrates a cross-sectional view of a portion of a stacked MIM capacitor structure according to one implementation of the present application. FIG. 8 represents a stacked MIM capacitor structure than can be used instead of the structure shown in outline 674 in FIG. 6. Stacked MIM capacitor structure 800 is formed by stacking two distinct MIM capacitors, i.e. MIM capacitor 830 and MIM capacitor 831. Stacked MIM capacitor structure 800 includes upper metal portion 822, interlayer metal levels 836, 840, and 848, interlayer dielectrics 838 and 844, interconnect metals 842a, 842b, and 850. MIM capacitor 830 includes insulating film 866 and top MIM metal 868, spacers 870 and vias 872 and 856. MIM capacitor 831 includes insulating film 867 and top MIM metal 869, spacers 871, and vias 873 and 858. Upper metal portion 822, interlayer metal levels 836, 840, and 848, interlayer dielectrics 838 and 844, interconnect metal 850, and vias 856 and 858 in MIM capacitor structure 800 in FIG. 8 are similar to corresponding structures in MOM capacitor structure 500A in FIG. 5A, and may have any implementations and advantages described above. MIM capacitor 830 having insulating film 866 and top MIM metal 868, spacers 870, vias 872, and interconnect metal 842a in stacked MIM capacitor structure 800 in FIG. 8 are similar to corresponding structures in MIM capacitor structure 700 in FIG. 7, and may have any implementations and advantages described above.

As shown in stacked MIM capacitor structure 800 in FIG. 8, MIM capacitor 831 is stacked over MIM capacitor 830. Insulating film 867 of MIM capacitor 831 is situated on interconnect metal 842a. Top MIM metal 869 of MIM capacitor 831 is situated over insulating film 867 and is in interlayer dielectric 844. Spacers 871 are situated adjacent to the sidewalls of insulating film 867 and top MIM metal 869 of MIM capacitor 831.

Vias 873 extend partially through interlayer dielectric 844 and connect top MIM metal 869 of MIM capacitor 831 to interconnect metal 850. Via 858 extends fully through interlayer dielectric 844 and connects interconnect metal 850 to interconnect metal 842b. Interconnect metal 842b is situated in interlayer metal level 840, and separated from interconnect metal 842a. Via 856 extends fully through interlayer dielectric 838 and connects interconnect metal 842b to upper metal portion 822. Thus, top MIM metal 869 of MIM capacitor 831, vias 873, interconnect metal 850, via 858, interconnect metal 842b, via 856, and upper metal portion 822 together form a first node of stacked MIM capacitor structure 800. Similarly, top MIM metal 868 of MIM capacitor 830, vias 872, and interconnect metal 842a form a second node of stacked MIM capacitor structure 800. When used in the RF signal path for an RF switch, such as in outline 674 in FIG. 6, MIM capacitor structure 800 further increases the capacitance value of capacitors integrated in the RF terminals of the RF switch.

Figure 9:
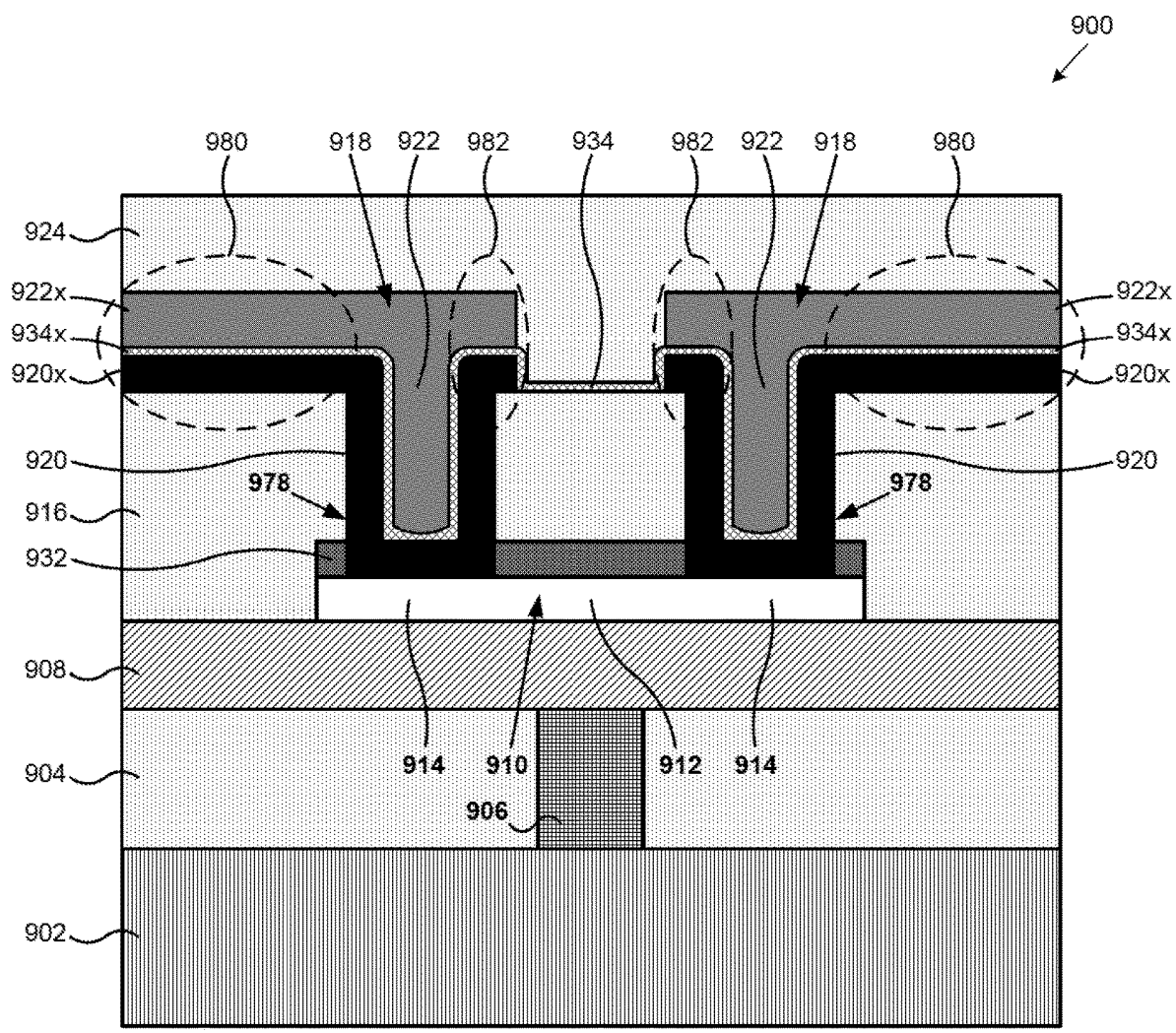
FIG. 9 illustrates a cross-sectional view of a portion of an RF switch according to one implementation of the present application.

FIG. 9 illustrates a cross-sectional view of a portion of an RF switch according to one implementation of the present application. RF switch 900 includes substrate 902, lower dielectric 904, heating element 906, thermally conductive and electrically insulating layer 908, PCM 910 having active segment 912 and passive segments 914, optional contact uniformity support layer 932, RF terminal dielectric segment 916, trenches 978. RF terminals 918 having trench metal liners 920 and trench metal plugs 922, dielectric liner 934, upper dielectric 924, and overhang regions 980 and 982 having trench metal liner extension 920x, dielectric liner extension 934x, and trench metal plug extension 922x. Substrate 902, lower dielectric 904, heating element 906, thermally conductive and electrically insulating layer 908, PCM 910 having active segment 912 and passive segments 914, optional contact uniformity support layer 932, RF terminal dielectric segment 916, and upper dielectric 924 in RF switch 900 in FIG. 9 are similar to corresponding structures in RF switch 300 in FIG. 3, and may have any implementations and advantages described above.

In RF switch 900, trenches 978 extend through RF terminal dielectric segment 916 and through optional contact uniformity support layer 932 (in case optional contact uniformity support layer 932 is used). Trench metal liners 920 of RF terminals 918 line trenches 978, and are ohmically connected to passive segments 914 of PCM 910. In various implementations, trench metal liners 920 can comprise W, Al, or Cu.

Dielectric liner 934 is situated in trenches 978, over trench metal liners 920. Dielectric liner 934 lines trench metal liners 920. In various implementations, dielectric liner 934 is a high-k dielectric, such as tantalum pentoxide, aluminum oxide, hafnium oxide, zirconium oxide, zirconium aluminum silicate, hafnium silicate, hafnium aluminum silicate or another dielectric with a relatively high dielectric constant. In one implementation, the thickness of dielectric liner 934 can range from approximately two hundred angstroms to approximately six hundred angstroms (200 Å-600 Å).

Trench metal plugs 922 are situated in trenches 978 over dielectric liner 934. In various implementations, trench metal plugs 922 can comprise W, Al, or Cu. As described below, trench metal plugs 922 are ohmically separated from, but capacitively coupled to, trench metal liners 920.

Outside trenches 978, trench metal liner extension 920x, dielectric liner extension 934x, and trench metal plug extension 922x are sequentially stacked over RF terminal dielectric segment 916 in overhang regions 980 and 982. Overhang regions 980 overhang away from active segment 912 of PCM 910, while overhang regions 982 overhang towards active segment 912 of PCM 910. Overhang regions 980 and 982 are optional in that the inventive concepts of the present application may be implemented without either or both, and trench metal plugs 922 would still capacitively couple to trench metal liners 920. However, capacitive coupling between trench metal plugs 922 and trench metal liners 920 is strengthened when overhang regions 980 and 982 are used.

Although trench metal plugs 922 are illustrated as integrally formed with trench metal plug extensions 922x, in one implementation they may be different formations. For example, trench metal plugs 922 may be situated in trenches 978 and a first interconnect metal (i.e., M1) may be subsequently formed over trench metal plugs 922 to form metal plug extensions 922x. In this example, trench metal plugs 922 can comprise W, and trench metal plug extensions 922x can comprise Al or Cu.

Trench metal plugs 922 are ohmically separated from, but capacitively coupled to, trench metal liners 920. Because RF switch 900 utilizes trench metal liners 920 and trench metal plugs 922, more interface area is available to capacitively couple, and capacitance values are increased compared to RF switch 300 in FIG. 3. Additionally, because RF switch 900 utilizes a thin high-k dielectric liner 934, the capacitive coupling between trench metal liner 920 and trench metal plug 922 is significantly increased. Moreover, because RF switch 900 utilizes overhang regions, capacitive coupling between trench metal liner 920 and trench metal plug 922 is further increased.

In an alternative implementation, only one trench metal plug 922 is capacitively coupled to a respective trench metal liner 920. In this alternative implementation, the other trench metal plug 922 is directly and ohmically connected to its respective trench metal liner 920 without using an intervening dielectric liner 934. As such, only one RF terminal 918 is capacitively coupled to a respective passive segment 914 of PCM 910, while the other RF terminal 918 is ohmically connected to its respective passive segment 914 of PCM 910.

Thus, various implementations of the present application achieve reliable RF switches that overcome the deficiencies in the art by providing capacitive contacts to connect with RF terminals of PCM RF switches while preserving or improving RF performance.

From the above description it is manifest that various techniques can be used for implementing the concepts described in the present application without departing from the scope of those concepts. For example, a single capacitor can be formed in the RF path near one RF terminal, while the other RF terminal only employs ohmic connections. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A radio frequency (RF) switch comprising:
   a phase-change material (PCM) and a heating element approximately underlying an active segment of said PCM and extending outward and transverse to said PCM;
   RF terminals comprising a trench metal liner separated from a trench metal plug by a dielectric liner;
   said trench metal liner of said RF terminals being ohmically connected to passive segments of said PCM;
   said trench metal plug of at least one of said RF terminals being ohmically separated from and capacitively coupled to said trench metal liner of said RF terminals by said dielectric liner.

2. The RE switch of claim 1, wherein said trench metal plug is connected to a first interconnect metal overhang to as to further capacitively couple said trench metal liner with said trench metal plug.

3. The RF switch of claim 1, further comprising an overhang region formed by a trench metal liner extension, a dielectric liner extension, and a trench metal plug extension, said overhang region further capacitively couples said trench metal liner with said trench metal plug.

4. The RF switch of claim 1, further comprising a contact uniformity support layer over said PCM.

5. The RE switch of claim 4, wherein said contact uniformity support layer comprises $Si_XN_Y$.

6. The RF switch of claim 4, wherein said contact uniformity support layer is a bi-layer that comprises material selected from the group consisting of $SiO_2$ and $Si_XN_Y$.

7. The RF switch of claim 1, wherein said PCM is selected from the group consisting of germanium telluride ($Ge_XTe_Y$), germanium antimony telluride ($Ge_XSb_YTe_Z$), germanium selenide ($Ge_XSe_Y$), and any other chalcogenide.

8. The RE switch of claim 1, further comprising a thermally conductive and electrically insulating layer situated over said heating element.

9. The RF switch of claim 8, wherein said thermally conductive and electrically insulating layer comprises material selected from the group consisting of aluminum nitride (AlN), aluminum oxide ($Al_XO_Y$), beryllium oxide ($Be_XO_Y$), silicon carbide (SiC), diamond, and diamond-like carbon.

10. A radio frequency (RF) switch comprising:
    a phase-change material (PCM);
    an RE terminal comprising a trench metal liner, a dielectric liner over said trench metal liner, and a trench metal plug over said dielectric liner;
    said trench metal liner of said RF terminal being ohmically connected to said PCM;
    said trench metal plug of said RF terminal being ohmically separated from and capacitively coupled to said trench metal liner of said RE terminal.

11. The RF switch of claim 10, wherein said trench metal plug is connected to a first interconnect metal overhang to as to further capacitively couple said trench metal liner with said trench metal plug.

12. The RF switch of claim 10, further comprising an overhang region formed by a trench metal liner extension, a dielectric liner extension, and a trench metal plug extension, said overhang region further capacitively couples said trench metal liner with said trench metal plug.

13. The RF switch of claim 10, further comprising a contact uniformity support layer over said PCM, wherein said contact uniformity support layer comprises $Si_XN_Y$.

14. The RF switch of claim 10, further comprising a contact uniformity support layer over said PCM, wherein said contact uniformity support layer is a bi-layer that comprises material selected from the group consisting of $SiO_2$ and $Si_XN_Y$.

15. The RF switch of claim 10, wherein said PCM is selected from the group consisting of germanium telluride ($Ge_XTe_Y$), germanium antimony telluride ($Ge_XSb_YTe_Z$), germanium selenide ($Ge_XSe_Y$), and any other chalcogenide.

16. A method for fabricating a radio frequency (RF) switch, said method comprising:
    forming a phase-change material (PCM);
    forming a trench metal liner of an RF terminal, said trench metal liner being ohmically connected to said PCM;
    forming a dielectric liner over said trench metal liner;
    forming a trench metal plug of said RF terminal over said dielectric liner, said trench metal plug being capacitively coupled to said trench metal liner.

17. The method of claim 16, further comprising forming a first interconnect metal overhang to further capacitively couple said trench metal liner with said trench metal plug.

18. The method of claim 16, further comprising forming an overhang region by a trench metal liner extension, a dielectric liner extension, and a trench metal plug extension, wherein said overhang region further capacitively couples said trench metal liner with said trench metal plug.

19. The method of claim 16, further comprising forming a contact uniformity support layer over said PCM.

20. The method of claim 16, wherein said PCM is selected from the group consisting of germanium telluride ($Ge_XTe_Y$), germanium antimony telluride ($Ge_XSb_YTe_Z$), germanium selenide ($Ge_XSe_Y$), and any other chalcogenide.

* * * * *

UNITED STATES PATENT AND TRADEMARK OFFICE
CERTIFICATE OF CORRECTION

PATENT NO. : 11,031,331 B2  
APPLICATION NO. : 16/685121  
DATED : June 8, 2021  
INVENTOR(S) : El-Hinnawy et al.

Page 1 of 1

It is certified that error appears in the above-identified patent and that said Letters Patent is hereby corrected as shown below:

In the Claims

Column 14, Line 64, Claim 2: "The RE switch of claim 1, wherein said trench metal" should be --The RF switch of claim 1, wherein said trench metal--

Column 15, Line 8, Claim 5: "The RE switch of claim 4, wherein said contact" should be --The RF switch of claim 4, wherein said contact--

Column 15, Line 17, Claim 8: "The RE switch of claim 1, further comprising a" should be --The RF switch of claim 1, further comprising a--

Column 15, Line 27, Claim 10: "an RE terminal comprising a trench metal liner, a dielectric" should be --an RF terminal comprising a trench metal liner, a dielectric--

Signed and Sealed this  
Third Day of August, 2021

Drew Hirshfeld  
*Performing the Functions and Duties of the*  
*Under Secretary of Commerce for Intellectual Property and*  
*Director of the United States Patent and Trademark Office*